(12) United States Patent
Jin et al.

(10) Patent No.: US 8,138,582 B2
(45) Date of Patent: Mar. 20, 2012

(54) IMPURITY INTRODUCING APPARATUS HAVING FEEDBACK MECHANISM USING OPTICAL CHARACTERISTICS OF IMPURITY INTRODUCING REGION

(75) Inventors: Cheng-Guo Jin, Yamato (JP); Yuichiro Sasaki, Machida (JP); Bunji Mizuno, Ikoma (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/710,482

(22) Filed: Feb. 23, 2010

(65) Prior Publication Data

US 2010/0148323 A1    Jun. 17, 2010

Related U.S. Application Data

(62) Division of application No. 10/572,144, filed as application No. PCT/JP2004/014292 on Sep. 22, 2004, now Pat. No. 7,700,382.

(30) Foreign Application Priority Data

Sep. 24, 2003  (JP) ................................. 2003-331330
Mar. 9, 2004   (JP) ................................. 2004-065317

(51) Int. Cl.
   *H01L 29/06*   (2006.01)
   *H01L 21/38*   (2006.01)

(52) U.S. Cl. ........... 257/655; 257/E21.077; 257/E21.21; 257/E29.005; 257/E33.075; 118/665; 118/712

(58) Field of Classification Search .................. 118/665, 118/712; 257/E21.077, E21.082, E21.333, 257/E21.12, E21.324, E21.454, E21.466, 257/E21.497, E29.005, E33.075, FOR. 407, 257/FOR. 408, FOR. 242, FOR. 334
See application file for complete search history.

(56) References Cited

U.S. PATENT DOCUMENTS

| 4,905,170 | A |   | 2/1990  | Forouhi et al. |
| 5,325,230 | A | * | 6/1994  | Yamagata et al. ............ 359/350 |
| 5,561,072 | A |   | 10/1996 | Saito |
| 5,580,820 | A | * | 12/1996 | Yamazaki ...................... 438/97 |
| 6,113,733 | A |   | 9/2000  | Eriguchi et al. |
| 6,128,084 | A |   | 10/2000 | Nanbu et al. |
| 6,485,872 | B1 |  | 11/2002 | Rosenthal et al. |

(Continued)

FOREIGN PATENT DOCUMENTS

EP    0 841 692 A2    5/1998

(Continued)

OTHER PUBLICATIONS

International Search Report for PCT/JP2004/014292; Nov. 22, 2004.

(Continued)

*Primary Examiner* — Hsien Ming Lee
*Assistant Examiner* — Walter H Swanson
(74) *Attorney, Agent, or Firm* — Pearne & Gordon LLP

(57) ABSTRACT

An impurity doping system is disclosed, which includes an impurity doping device for doping an impurity into a surface of a solid state base body, a measuring device for measuring an optical characteristic of an area into which the impurity is doped, and an annealing device for annealing the area into which the impurity is doped. The impurity doping system realizes an impurity doping not to bring about a rise of a substrate temperature, and measures optically physical properties of a lattice defect generated by the impurity doping step to control such that subsequent steps are optimized.

10 Claims, 10 Drawing Sheets

U.S. PATENT DOCUMENTS

| | | | |
|---|---|---|---|
| 7,091,114 B2 * | 8/2006 | Ito et al. | 438/527 |
| 2003/0153101 A1 * | 8/2003 | Takase et al. | 438/7 |
| 2004/0252306 A1 | 12/2004 | Morris | |

FOREIGN PATENT DOCUMENTS

| | | |
|---|---|---|
| JP | H7-142421 A | 6/1995 |
| JP | 11-87448 A | 3/1999 |
| JP | 11-274093 A | 10/1999 |
| JP | 11-330185 A | 11/1999 |
| JP | 2000-282425 A | 10/2000 |
| JP | 2001-230291 A | 8/2001 |
| TW | 442885 B | 6/2001 |
| WO | 01/88955 A2 | 11/2001 |

OTHER PUBLICATIONS

Chinese Office Action for JP2004-0027712.7.

European Search Report for EP 04 77 3469; Jan. 19, 2009.

* cited by examiner

IMPURITY INTRODUCING APPARATUS HAVING FEEDBACK MECHANISM USING OPTICAL CHARACTERISTICS OF IMPURITY INTRODUCING REGION

This application is a division of U.S. patent application Ser. No. 10/572,144 filed Mar. 14, 2006, which is incorporated herein by reference in its entirety.

TECHNICAL FIELD

The present invention relates to an impurity doping method, an impurity doping system, and an electronic device formed by using them and, more particularly, an impurity doping applied in forming a semiconductor device, especially the electronic device, or a liquid crystal panel manufacturing method.

BACKGROUND ART

The technology to form a shallow junction is demanded in recent years with the miniaturization of the semiconductor device. In the semiconductor manufacturing technology in the prior art, the method of ion-implanting various conductivity types of impurities such as boron (B), phosphorus (P), arsenic (As), and the like into a surface of a semiconductor substrate as a solid state base body at a low energy is widely employed.

Since a semiconductor device having a shallow junction is formed by using this ion-implanting method, a shallow junction can be formed actually, though there is a limit to a depth that can be formed by the ion implantation. For example, because a boron impurity is hard to dope shallowly, a limit of a depth of a doped area formed by the ion implantation is at almost 100 nm from a surface of the base body.

Therefore, recently various doping methods have been proposed as the approach of making a shallower junction possible. Out of them, much attention is now focused on the plasma doping technology as the technology that is suited to practical use. This plasma doping is the technology that excites a reaction gas containing a doped impurity by the plasma and irradiates the plasma onto a surface of the solid state base body to dope the impurity. Then, activation of the doped impurity is carried out by the annealing step after the impurity is doped.

Normally, a light source that can emit an electromagnetic wave in a wide wavelength range such as a visible radiation, an infrared radiation, a ultraviolet radiation, and the like is employed in the annealing step. However, a wavelength effective for the activation is difference depending on a crystal condition of the solid state base body itself into which the impurity is doped. Actually such wavelength often exists in a narrow range. An irradiation of the light of unnecessary wavelengths raises a temperature of the substrate and causes the characteristic deterioration in some cases.

In recent years, the method of measuring a quantity of impurity doped in a surface of a solid state base body by the optical measurement has been proposed (see JP-A-2000-282425, for example). Since this method measures a quantity of radical by the optical measurement, a doping amount can be measured by sensing an amount of current.

DISCLOSURE OF THE INVENTION

A doped amount of the impurity, i.e., a total amount of impurity doped into the solid state base body is sensed by the above method. Certainly it is important to measure a total amount of doped impurity. But it is extremely important to sense a condition such as a crystal condition in the impurity doped area, i.e. how many lattice defects are introduced when the semiconductor device is formed by doping the impurity into a silicon substrate or when a liquid crystal panel is manufactured by forming TFTs (thin film transistors) on a liquid crystal substrate, in realizing the optimal plasma doping and the optimal annealing subsequently executed by an energy irradiation such as a light irradiation, or the like.

The present invention has been made in view of the above circumstances, and aims at providing the impurity doping technology that realizes an electrical activation of an impurity not to bring about a temperature rise of a substrate.

Also, the present invention aims at measuring optically physical properties of a lattice defect generated in a single crystal silicon or a polycrystalline silicon by the impurity doping step while a semiconductor device is formed on a silicon substrate, a liquid crystal panel is manufactured, or the like, and then controlling conditions of the impurity doping step to optimize the conditions in subsequent steps.

Therefore, an impurity doping method of the present invention, includes a step of doping an impurity into a surface of a solid state base body; a step of measuring an optical characteristic of an area into which the impurity is doped; a step of selecting annealing conditions based on a measurement result to meet the optical characteristic of the area into which the impurity is doped; and a step of annealing the area into which the impurity is doped, based on the selected annealing conditions.

According to this method, the optical characteristic of the area into which the impurity is doped are measured previously, and the optimum annealing can be realized in response to the optical characteristic, whereby the impurity doped area can be formed highly effectively with high precision.

In this case, the impurity doping step contains not only the step of doping the impurity simply but also the step of controlling a surface condition to get the optical characteristic suitable for the annealing step such that the energy can be absorbed effectively in the annealing step containing mainly the light irradiation subsequently executed. The control of the optical characteristic contains a step of controlling a composition of the plasma by changing a mixture ratio between an impurity substance to constitute the plasma and an inert substance or a reactive substance as a substance mixed with the impurity substance, to control the optical characteristic of the area into which the impurity is doped. That is, the step of supplying the impurity substance onto the surface of the solid state base body simultaneously or sequentially with the inert substance such as a nitrogen, a rare gas, or the like and the reactive substance such as an oxygen, a silane, a disilane, or the like and then forming the optical characteristics suitable for the annealing step is contained. The "impurity doping method" in the present invention indicates a series of steps containing the annealing step.

Also, in the present invention, the step of doping the impurity contains a plasma doping step.

According to this method, the impurity can be doped in a shallow area. Also, in the present invention, the step of doping the impurity contains an ion implanting step.

According to this method, the annealing step consisting mainly of the light irradiation executed subsequently can be made highly effective, and also the high-precision plasma doping can be accomplished.

Also, in the present invention, the measuring step is executed prior to the annealing step.

According to this method, the condition of the area into which the impurity is doped can be sensed before the annealing, and the annealing conditions can be selected thereafter, whereby the optimum activation state can be obtained.

Also, in the present invention, the measuring step is executed in parallel with the annealing step.

According to this method, the condition of the area into which the impurity is doped can be sensed during the annealing, and the annealing conditions can be selected thereafter, whereby the optimum activation state can be obtained.

Also, in the present invention, the annealing step is divided into plural numbers of time, and the measuring step is executed among the annealing step.

According to this method, the annealing step is divided into plural numbers of time, the condition of the area into which the impurity is doped can be sensed during the annealing, and the annealing conditions can be selected thereafter. Thus, the optimum activation state can be obtained.

Also, in the present invention, the step of selecting the annealing conditions contains a step of causing the annealing conditions to change sequentially following upon a change of the optical characteristic of the impurity doped area during the annealing step.

According to this method, the change of the area into which the impurity is doped by the annealing can be sensed, and the annealing conditions can be selected thereafter. Thus, the optimum activation state can be obtained.

Also, in the present invention, the impurity doping step is divided into plural numbers of time, and the measuring step is executed among the impurity doping step.

According to this method, since the measuring step is executed among the impurity doping step, the optical characteristic can be measured precisely according to the situation in the chamber in the impurity doping step and also the high-precision impurity doping can be realized. Also, though the doping of the impurity must be stopped once, this example is effective for the doping using the atmospheric pressure plasma, or the like.

An impurity doping method of the present invention, includes a step of doping an impurity into a surface of a solid state base body; a step of measuring an optical characteristic of an area into which the impurity is doped; a step of adjusting the optical characteristic based on a measurement result to meet annealing conditions; and a step of annealing an area into which the impurity is doped.

This method is effective for the case where there is a restriction on the annealing conditions.

Also, in the present invention, plasma doping conditions are controlled such that optical constants meet a light irradiation executed after the plasma doping step, while monitoring the optical constants of the area into which the impurity is doped.

According to this method, the impurity doped area having a higher-precision depth and dosage can be formed. Here, as the optical constant, the reflectance, or the like can be applied in addition to the light absorption coefficient.

Also, in the present invention, the measuring step is a step of using an ellipsometry.

Also, in the present invention, the step of using the ellipsometry contains an ellipsometry analyzing step of calculating both a thickness of the impurity doped layer and optical constants (a refractive index n and an extinction coefficient k).

Also, in the present invention, the ellipsometry analyzing step contains an analyzing step employing a refractive index wavelength dispersive model using any one of K-K (Kramers-Kronig) analysis, Tauc-Lorentz analysis, Cody-Lorentz analysis, Forouhi-Bloomer analysis, MDF analysis, band analysis, Tetrahedral analysis, Drude analysis, and Lorentz analysis. It is particularly desirable to employ the refractive index wavelength dispersive model since the absorption characteristic can be handled.

Also, in the present invention, the measuring step contains a step of using XPS in the impurity doping method.

Also, in the present invention, the annealing step is a step of irradiating an electromagnetic wave.

Also, in the present invention, the annealing step is a step of irradiating a light.

Also, in the present invention, the step of doping the impurity is a step of doping an impurity such that a light absorption coefficient of the area into which the impurity is doped exceeds $5 \, E^4 \, cm^{-1}$.

According to this method, the annealing conditions having the high light absorbency and the high efficiency can be selected.

Also, in the present invention, the plasma doping step contains a step of controlling at least one of a power supply voltage applied to the plasma, a composition of the plasma, and a ratio between an irradiation time of the plasma containing a dopant substance and an irradiation time of the plasma not containing the dopant substance.

According to this method, the effective control can be executed. Here, the composition of the plasma is controlled by adjusting a mixture ratio between the impurity substance as the dopant and other substance, a vacuum, a mixture ratio between other substances, etc.

Also, in the present invention, the plasma doping step contains a step of controlling a composition of the plasma by changing a mixture ratio between an impurity substance to constitute the plasma and an inert substance or a reactive substance as a substance mixed with the impurity substance, to control the optical characteristic of the area into which the impurity is doped. Here, the optical characteristics are controlled by changing a mixture ratio among the substance such as arsenic, phosphorous, boron, aluminum, antimony, indium, or the like as the impurity substance, the inert gas such as helium, argon, xenon, or the like as the mixed substance, and the reactive substance such as nitrogen, oxygen, silane, disilane, or the like.

Also, in the present invention, the plasma doping step sets the optical constant of the area into which the impurity is doped such that electrical activation of the impurity contained in the area into which the impurity is doped is accelerated and an energy absorption into the solid state base body is suppressed.

According to this method, the annealing can be accomplished selectively effectively not to increase a temperature.

An impurity doping system of the present invention, includes an impurity doping means for doping an impurity into a surface of a solid state base body; a measuring means for measuring an optical characteristic of an area into which the impurity is doped; and an annealing means for annealing the area into which the impurity is doped.

Accordingly, the surface condition can be sensed easily.

Also, in the present invention, the impurity doping system further includes a doping controlling means for controlling the plasma doping means based on measurement results of the measuring means.

Also, in the present invention, the impurity doping system further includes an annealing controlling means for controlling the annealing means based on measurement results of the measuring means.

Also, in the present invention, the impurity doping system further includes a feedback mechanism for feeding back a measurement result of the measuring means to any one of the annealing controlling means or the impurity doping controlling means.

Also, in the present invention, the feedback mechanism executes a feedback of a measurement result in-situ.

Also, in the present invention, the feedback mechanism executes a sampling inspection at a high speed, and executes an additional process such as an additional doping, annealing conditions relaxation, or the like if a result is not good.

Also, an electronic device of the present invention formed by doping an impurity by using the impurity doping method of the present invention.

Figure 1:
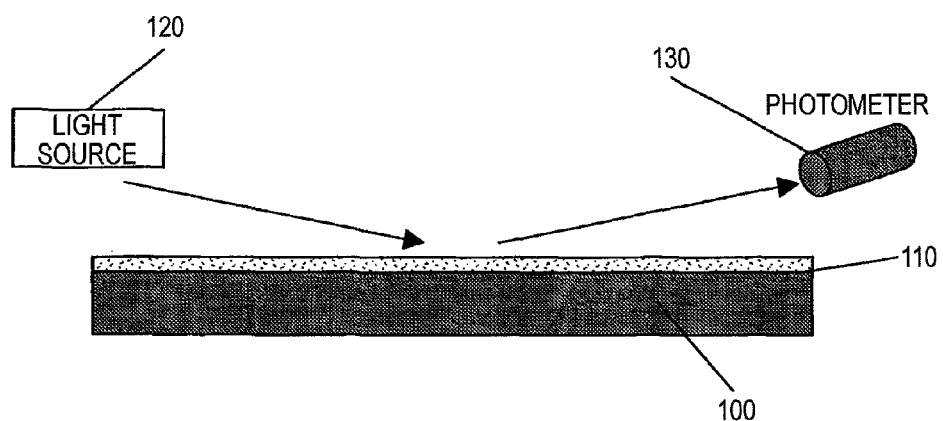
FIG. 1 is a view explaining an optical measurement of an impurity doped layer generated in vicinity of a surface of a solid state base body in a first embodiment of the present invention.

In Figures, a reference numeral 100 is a solid state base body, 110 an impurity doped layer, 120 a light source, 130 a photometer, 200 a vacuum chamber, 210 a vacuum pump, 230 a vacuum gauge, 240 a plasma source, 250 a power supply, 260 a substrate holder, 270 a power supply, 280 a first line, 290 a second line, 300 a third line, 310 a plasma, 320 a computer, 340 a control circuit, 350 a controller, 500 a substrate holder, 510 a white light source, 520 a filter, 530 a selected light, 600 a nitrided light, 610 an oxidized light, 700 a laser light source, 710 a modulation filter, and 720 a modulated light.

BEST MODE FOR CARRYING OUT THE INVENTION

Next, embodiments of the present invention will be explained hereinafter.

The present invention gives roughly three embodiments. The first of the embodiments resides in that conditions of the impurity doped into the solid state base body is sensed by the optical measurement. This signifies not only the optical measurement of the impurity itself but also the optical measurement of the "composite layer" condition including the crystal condition of the solid state base body itself, the physical change of the crystal condition of the solid state base body such as a damage caused by an energy applied in the doping, or the like, and the chemical change of the solid state base body such as a generation of a oxide layer/a nitride layer, or the like. The second of the embodiments resides in that the annealing conditions are optimized according to the sensed conditions of the impurity. The third of the embodiments resides in that the doping of the impurity is controlled to meet the annealing conditions.

In other words, in the method of the present invention, a quality of the impurity doping is improved further by applying a feedback control to the doping of the impurity after conditions of the impurity are grasped. Also, for example, in the semiconductor device or the liquid crystal display as the major application field of the present invention, the impurity in the semiconductor is activated electrically by supplying the energy to the base body by virtue of any method after the impurity is introduced into the solid state base body. In order to derive the best result in this step, the steps applied while the impurity is being doped are controlled.

Embodiment 1

In the present embodiment 1, a method of doping the impurity into the solid state base body by using particles having an energy (several tens eV or more) that is sufficiently higher than a bond energy of the lattice will be explained hereunder. When the particles having the energy (several tens eV or more) that is higher sufficiently than the bond energy of the lattice in doping the impurity into this solid state base body, formation of the lattice defect in the lattices, which constitute the crystalline or noncrystalline substance to construct the solid state base body, and the impurity substance itself cause physical properties of the solid state base body to change, so that an impurity doped layer (new second layer) 110 having physical properties that are different from a solid state base body 100 is formed.

Also, in the step of doping the impurity with a relatively small doping energy applied when a thermal equilibrium condition is changed, or the like, the impurity doping step causes the physical properties of the solid state base body to change and subsequently the new (second) layer 110 made mainly of the impurity substance itself is formed in close vicinity of a surface of the solid state base body.

Therefore, according to the ellipsometry, as shown in FIG. 1, a light is irradiated onto the surface of the solid state base body by using a light source 120 and then the light is measured by a photometer 130.

A method of measuring a thickness of an impurity doped layer and a light absorption coefficient by using the ellipsometry will be explained with reference to a configurative view of a spectroellipsometer in FIG. 2 hereunder.

Figure 2:
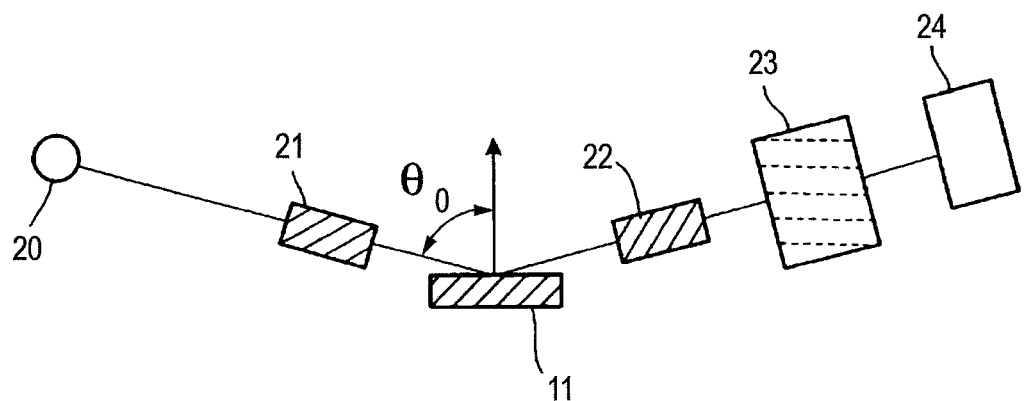
FIG. 2 is a configurative view of a spectroellipsometer used to explain a method of deriving a thickness of the impurity doped layer and a light absorption coefficient.

As shown in FIG. 2, this spectroellipsometer includes a Xe light source 20, a polarizer 21 for polarizing a Xe light output from this light source to irradiate onto a substrate as a sample 11, an analyzer 22 for sensing a reflected light from the sample 11, a spectrometer 23, and a detector 24. Here, the Xe light output from the Xe light source 20 is converted into a linearly polarized light by the polarizer 21, and then is incident onto the substrate at an angle $\theta_0$ to the direction perpendicular to the substrate surface. This angle $\theta_0$ is fixed to $\theta_0=70°$ in this measurement, but the measurement can be done if this angle is changed in a range of 45° to 90°. An axis of the linear polarization of the incident light is tilted with respect to a p-direction (direction of a line of intersection between a plane perpendicular to an optical axis and a plane containing the incident light and the reflected light) and an s-direction (direction perpendicular to the p-direction in the plane perpendicular to the optical axis). Assume that an amplitude reflectance ratio between a p-component and an s-component of the light reflected as an elliptically polarized light is Ψ and a phase difference between the p-component and the s-component is Δ. The ellipsometry is constructed such that the light reflected as the elliptically polarized light is incident on the spectrometer 23 via the analyzer 22, and then Ψ and Δ are measured by the detector 24 while analyzing the light by the spectroscope.

A method of deriving not only a thickness of the impurity doped layer but also optical constants (a refractive index n and an extinction coefficient k) as an unknown parameter based on the ellipsometry measurement results of Ψ, Δ by the method of least squares will be explained hereunder. The impurity doped layer is referred to as a PD layer, and three-layered model consisting of Air/PD layer/c-Si was used. Since the optical coefficient has the wavelength dependency, unknown parameters are increased as many as the number of measured wavelengths when the measurement is done while changing a wavelength, so that the unknown parameters cannot be derived. In such case, spectra of the optical coefficients can be derived if such spectra of the optical coefficients are expressed by the approximate expression containing constants that do not depend on the wavelength and then the constants are used as the unknown parameters.

As the refractive index wavelength dispersive model, various examples have been proposed. Because the strong absorption characteristic of the PD layer must be handled, the K-K (Kramers-Kronig) analysis method was used in the present embodiment. Even when Tauc-Lorentz analysis, Cody-Lorentz analysis, Forouhi-Bloomer analysis, MDF analysis, band analysis, Tetrahedral analysis, Drude analysis, Lorentz analysis, or the like is employed as the refractive index wavelength dispersive model, the above analysis can be conducted.

Next, the feature of the K-K (Kramers-Kronig) analysis method will be explained hereunder.

When a light absorption band of a thin film layer is present within a measured wavelength range, not only the refractive index but also the extinction coefficient can be derived by using the dispersion formula (Equation 1) of the complex refractive index derived from a following Kramers-Kronig relations.

Formula 1

$$n = 1 + \frac{2}{\pi} P \int_0^\infty \frac{\omega' k}{\omega'^2 - \omega'^2} d\omega' \quad (1)$$

$$k = -\frac{2}{\pi} P \int_0^\infty \frac{\omega' k}{\omega'^2 - \omega'^2} d\omega'$$

where P is a principal value of Cauchy integral, and ω is a frequency.

These relations indicate that, if the extinction coefficient has already been known, the refractive index can be estimated based on the extinction coefficient. When a light absorption band is present within a measured wavelength range, the spectrum of the extinction coefficient in the wavelength range is approximated by the Lorentz-type formula (Equation 2).

Formula 2

$$k = C1(E-C4)^2/(E^2-C2E+C3) \quad (2)$$

where E is a photon energy (eV), and has a relation with a wavelength λ, (nm) shown in following Equation (3).

Formula 3

$$E(eV) = 1239.84/\lambda(nm) \quad (3)$$

A following Equation (4) of the refractive index can be derived by integrating the Kramers-Kronig relations (1) while using Equation 2.

Formula 4

$$n = C5 + f(E) \quad (4)$$

where f(E) is an integrated value, and C5 is an integration constant.

In this K-K analysis, C1, C2, C3, C4, C5 act as parameters and gives initial values. Since C5 is one of parameters representing the refractive index by the integration constant, the rough refractive index of the PD layer is set as an initial value. In C1, the rough extinction coefficient, i.e., the value of the peak extinction coefficient of the extinction coefficient spectrum gives an initial value.

In contrast, C2, C3 are relevant to the peak E (eV) of the extinction coefficient spectrum, and C2 can have a twice value of the peak E (eV) as the rough initial value whereas C3 can have a square value of the peak E (eV) as the rough initial value. Since C4 is related to an energy band width of the absorption band, the E (eV) value that has the smallest extinction coefficient at a foot of the peak of the extinction coefficient spectrum can be used as an initial value.

As described above, when the K-K analysis is employed, the analysis can be made if the initial value is set by assuming the absorption spectrum, i.e., the extinction coefficient spectrum, while taking the physical properties of the thin film as the object substance in the measurement into account.

In the K-K analysis model, the setting of parameters is difficult in contrast to other models and also the fitting calculation is difficult. No fitting can be obtained according to the setting of the parameters. Therefore, the K-K analysis must be employed after the user becomes familiar with the measurement analysis to some extent and understands the characteristics of the model.

After the thickness of the impurity doped layer and the optical constants (the refractive index n and the extinction coefficient k) are detected by the above method, the light absorption coefficient can be calculated by a following Equation (5).

$$\alpha = 4\pi k/\lambda \quad (5)$$

Figure 3:
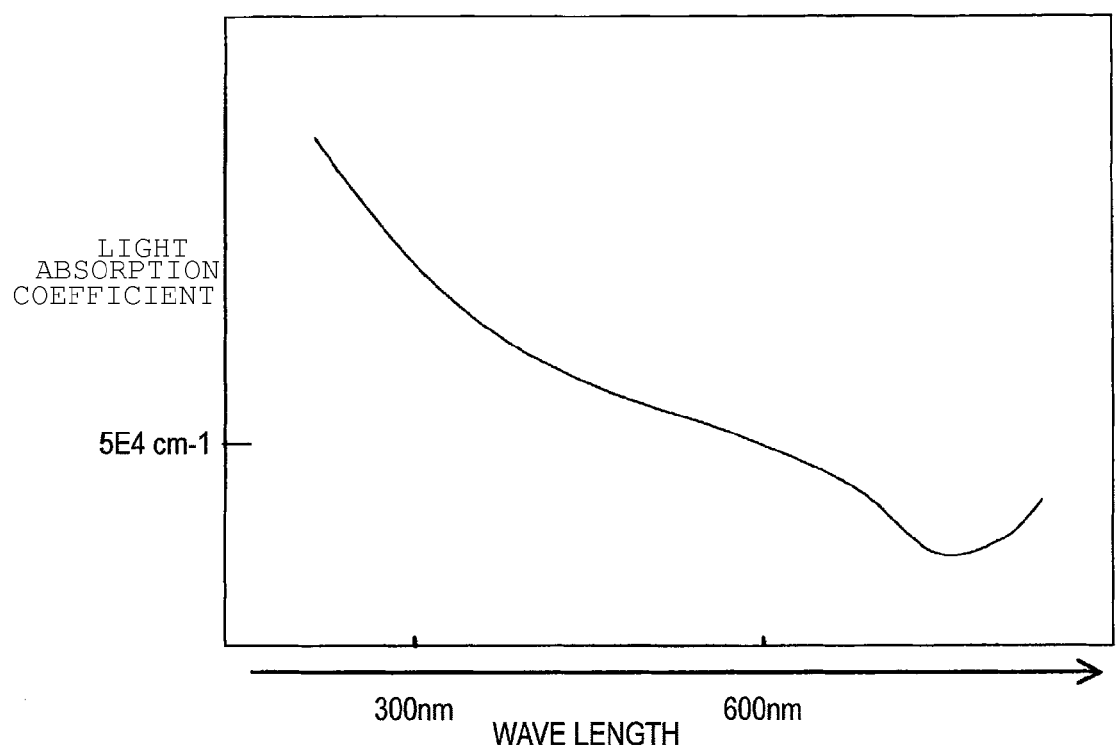
FIG. 3 is a graph showing the light absorption coefficient of the impurity doped layer measured by the ellipsometer.

A spectrum representing the optical characteristics of the impurity doped layer 110 is shown in FIG. 3.

As apparent from FIG. 3, when considered based on the measurement result using the ellipsometry, the light absorption coefficient the light between a wavelength 300 nm to 600 nm is increased.

Therefore, the activation can be effectively attained by irradiating the light having the wavelength 300 nm to 600 nm in the subsequent step, and thus the impurity can be activated effectively by a smaller irradiation energy.

In this manner, in the present embodiment, the surface condition of the solid state base body into which the impurity is introduced are measured, and then the main factors in the subsequent step are decided based on the measurement result.

Meanwhile, in the semiconductor industry or the liquid crystal industry, the impurity doped layer 110 formed by doping the impurity is activated electrically by irradiating an electromagnetic wave. This means that the crystals of silicon as the major constituent element of the solid state base body are destroyed by the step of doping the impurity at an energy higher than a bond energy of the lattice, then the lattice defects that are introduced into the impurity doped layer (the impurity doped area) are recovered by irradiating the electromagnetic wave onto the impurity doped layer in the subsequent step, and then the impurity doped layer is changed into the electrically active condition.

At this time, the condition of the impurity doped layer depends on a relationship between physical properties of the substance constituting the solid state base body and the impurity substance. The impurity substance enters into the lattice position of the silicon, for example, by the substitution, and the crystallization is accelerated and thus the impurity doped layer becomes the electrically active condition.

Therefore, in order to realize such process, the impurity is electrically activated effectively in irradiating a visible radiation, for example. Here, it is desirable that the light absorbing spectrum of the impurity doped layer should be analyzed and then the light of an adequate wavelength should be irradiated based on the result. Also, when the solid state base body 100 and the impurity doped layer 110 are mixed together on the surface, the light absorbing spectrum of the solid state base body itself is analyzed, then the wavelength band in which the light absorption coefficient of the solid state base body 100 is small but the light absorption coefficient of the impurity doped layer 110 is large is selected, and then the light in this wavelength band is irradiated. Thus, the impurity doped layer can be activated while suppressing a temperature rise of the solid state base body 100.

As described above, in the present embodiment, because the optical measurement utilizing the ellipsometry is used, the light absorption coefficient can be calculated correspondingly. In particular, since a diffusion phenomenon generated in the solid state base body acts as a major factor to prevent the miniaturization in forming the fine device having a small size, the irradiation of a light of a particular wavelength only can prevent the diffusion in a sense of providing no useless energy to the solid state base body, and thus the present embodiment is effective for the formation of the fine device. Especially a large number of thermal treatment processes must be applied when a large number of impurity doping steps are contained. According to the present invention, extension of an unnecessary diffusion length can be suppressed by irradiating only the light of the particular wavelength.

In this case, the optical characteristic measuring method is not limited to the ellipsometry, and XPS, or the like can be selected appropriately.

Embodiment 2

Next, a method of employing a plasma doping method as the impurity doping method while using this method will be explained hereunder.

Figure 4:
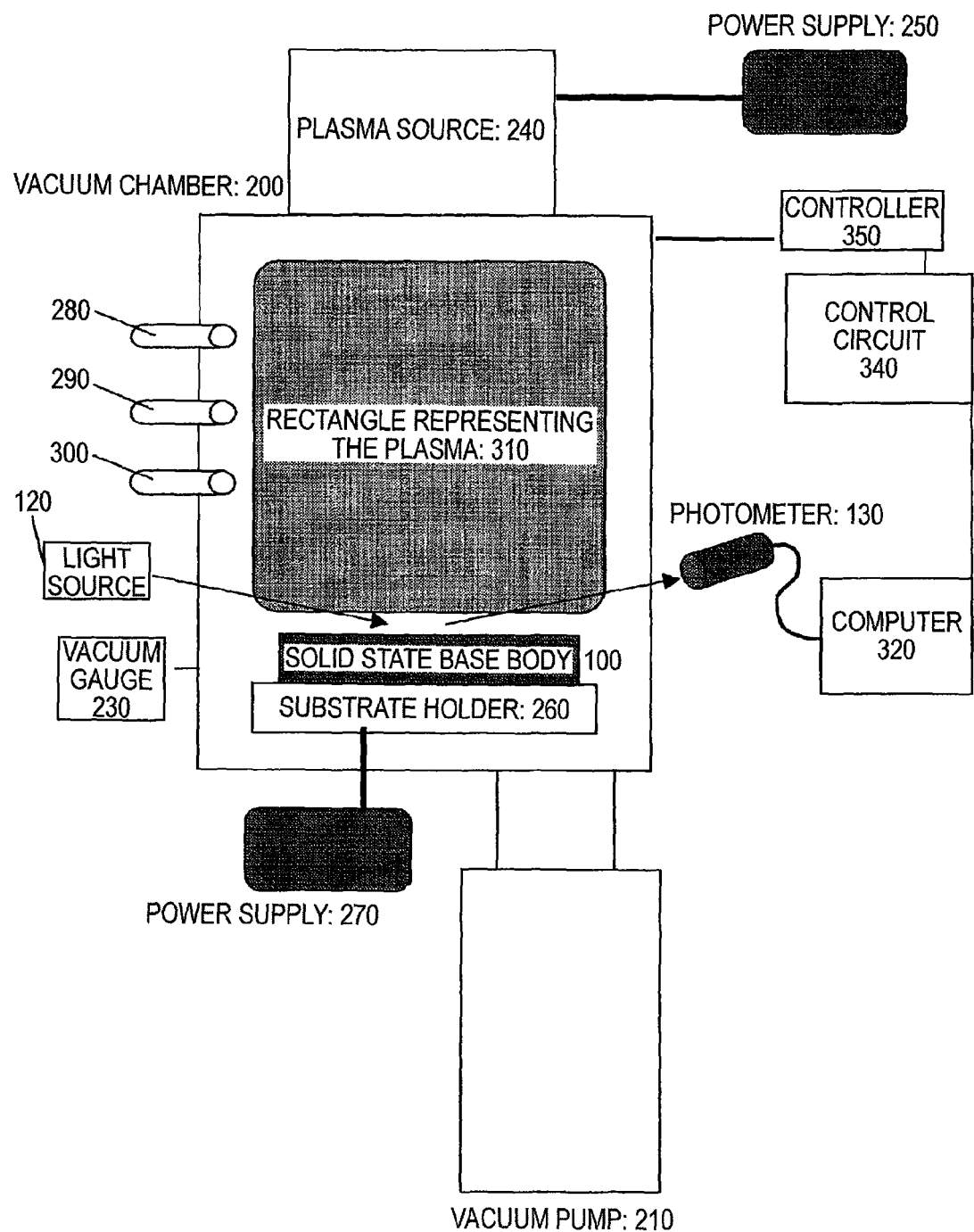
FIG. 4 is a sectional configurative view showing a system used in the invention of this application that employs a plasma doping method in a second embodiment of the present invention.

First, a plasma doping system and an impurity doping controlling system used in the present embodiment will be explained, and then several types of controlling method will be described in detail. As shown in FIG. 4, the plasma doping system employed in the present embodiment includes the light source 120 and the photometer 130 as the measuring means for measuring the optical characteristics of the impurity doped area on the solid state base body 100, and a controlling means for controlling the doping conditions based on the optical characteristics obtained by this measuring means. This system feedback-controls the doping conditions such that the optimum surface condition can be obtained.

In other words, this plasma doping system includes a vacuum chamber 200, and a plasma source 240 for generating the plasma in the vacuum chamber 200, and applies the plasma doping onto the surface of the solid state base body 100 loaded on a substrate holder 260 as the processed base body.

Then, a vacuum pump 210 is connected to this vacuum chamber 200, and a vacuum gauge 230 for measuring a vacuum is provided to the vacuum chamber 200. A power supply 250 is connected to the plasma source 240. Also, a power supply 270 for applying a unique electrical potential is connected to the substrate holder 260 separately from the above power supply.

Also, a gas introducing mechanism for introducing these gases is provided to the vacuum chamber 200. This gas introducing mechanism is constructed by a first line 280 for supplying a first substance as a dopant substance, a second line 290 for supplying a second substance (He in this case) as other substance, and a third line 300 for supplying a third substance (Ar in this case).

Also, the controlling means includes a computer 320 for computing the optical characteristics measured by the photometer, a control circuit 340 for deciding the controlling conditions based on the computed result, and a controller 350 for feedback-controlling the doping conditions of the plasma doping system based on an output of the control circuit.

Next, a doping method using this doping system will be explained hereunder.

Here, the case where a gas is utilized as a doping source will be explained hereunder.

First, the dopant substance as the first substance is supplied to the vacuum chamber 200. Here, other substance different from this dopant substance is introduced as a carrier gas or the material that possesses a particular function. In the present embodiment, a gas having different properties from the dopant substance, e.g., a rare gas, or the like, which does not become electrically active in the silicon, is selected. By way of example, there is He or Ar. Then, He is selected as the second substance, and Ar is selected as the third substance. Then, a plasma 310 is generated on the surface of the solid state base body 100 in the vacuum chamber 200 by introducing the gases from the gas introducing lines consisting of the first to third lines 280, 290, 300.

The charged particles in the plasma are attracted by an electric potential difference between the plasma 310 and the solid state base body 100, so that the impurity doping is applied. At the same time, the electrical neutral substances in the plasma are adhered or occluded in vicinity of the surface of the solid state base body 100. Here, the condition of the impurity doped layer 110 is decided by the condition of the underlying solid state base body 100 and the energy of the plasma, and the impurity may be adhered or may be occluded.

According to this impurity doping step, the impurity doped layer 110 explained in the above embodiment is formed on the surface of the solid state base body 100. In order to measure the physical properties of the impurity doped layer, the light source 120 and the photometer 130 are provided to the vacuum chamber 200. Then, the optical characteristics measured by the photometer 130 are computed by the computer 320, then the computed result is fed to the control circuit 340, and then the data are fed to the controller 350 as feedback information, whereby the plasma doping system adjusts the plasma conditions and controls the physical properties of the impurity doped layer.

As the plasma conditions to be adjusted here, there are a power supply voltage applied to the plasma or a voltage application time and an application timing, a mixture ratio of the dopant substance and other substance, a vacuum degree, a mixture ratio of other substances, a ratio between an irradiation time of the plasma containing the dopant substance and an irradiation time of the plasma not containing the dopant substance, and others. The physical properties of the impurity doped layer are controlled by changing these parameters.

As Examples of the present invention, respective examples in which these parameters are changed will be explained subsequently hereunder. Now the method of mixing a power and a gas will be described in detail herein.

EXAMPLES

Example 1

First, a method of changing a power will be explained as Example 1.

It has already been known that a plasma density and an energy of the charged particles (mainly positively charged ions) reaching the substrate are decided depending on a power supplied to generate the plasma and a power supply connected to the substrate holder. An example in which a power of the power supply 270 connected to the substrate holder 260 is changed mainly will be described herein.

First, a power of 1000 W was supplied from the power supply 250 used to generate the plasma. In order to cause this generated plasma 310 to reach effectively the substrate, a power was supplied to the substrate holder 260. First, the plasma doping was started by supplying 100 W. At this time, a thickness of the impurity doped layer needed finally was set to 15 nm.

Here, a dopant substance $B_2H_6$ was employed and also He was employed as other substance. $B_2H_6$ is introduced by 2 SCCM and He is introduced by 10 SCCM. A vacuum was set to 1 Pa. First, the doping was executed for 5 second while 100 W was being supplied from the power supply 250.

In this state, as shown in FIG. 1 and FIG. 4, the optical constant (light absorption coefficient) of the impurity doped layer was measured by the photometer 130. As a result, it was found that a thickness of the impurity doped layer, as the result computed by the computer 320, is 12 nm.

Then, the conditions applied to set a thickness of the impurity doped layer to 15 nm were calculated by the control circuit 340, based on a database formed based on the measurement result measured by the inventors themselves. Then, the controller 350 increased a power supplied from the power supply 250 up to 115 W based on the calculated result, and then the plasma doping was carried out for 3 second.

Then, it was confirmed by the photometer 130 that a thickness of the impurity doped layer comes up to 15 nm. Then, the power supply 250 was turned OFF, then the plasma 310 was put out, and then the process was ended.

Example 2

Figure 5:
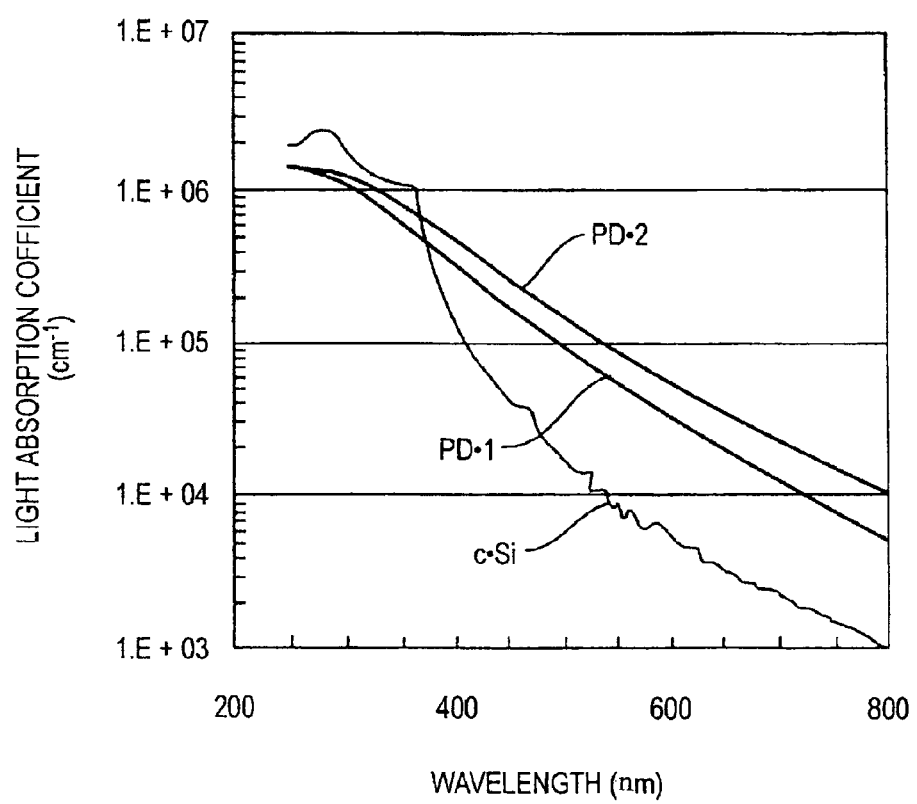
FIG. 5 is a graph showing spectra of absorption coefficients of samples PD-1 (bias voltage 30 V, process time 60 s) and PD-2 (bias voltage 60 V, process time 60 s), and a crystalline silicon substrate for the sake of comparison.

Spectra of absorption coefficients of samples PD-1 (bias voltage 30 V, process time 60 s) and PD-2 (bias voltage 60 V, process time 60 s), and a crystalline silicon substrate for the sake of comparison, which were derived by using the K-K (Kramers-Kronig) analysis method, are shown in FIG. 5. In this case, when the bias power supply voltage was increased within a wavelength range of 400 nm to 800 nm for a same plasma doping time of 60 sec, the light absorption coefficient of the PD layer was increased. This result concluded that PD-2 is suitable for the case where the annealing method using the wavelength of 400 nm to 800 nm, for example, is employed. That is, the ellipsometry measurement result could be fed back to the optimization of the annealing, so that the validity of the ellipsometry measurement using the K-K (Kramers-Kronig) analysis method was verified.

Example 3

Next, an example in which a method of mixing a gas in the impurity doping step is controlled will be explained hereunder as Example 3.

When the silicon substrate was utilized as the solid state base body 100, for example, in forming the impurity doped layer 110, the crystal lattices were disturbed by the dopant substance and other substances and thus such substrate become its amorphous state. It filled the important role in the subsequent step to convert this amorphous state to a desired state.

In this Example, $BF_3$ was used as the dopant substance and He and Ar were used as other substances. Here, a quantity of $BF_3$ serving as the dopant substance was kept constant, but a thickness of the impurity doped layer 110 was changed.

First, the plasma was generated for 5 sec by introducing Ar to form a part of the impurity doped layer 110. A thickness of the impurity doped layer 110, when measured by the photometer, was 5 nm. Then, $BF_3$ was introduced into the doped impurity doped layer 110, and gas-adsorption was applied for 5 sec. Then, the $BF_3$ plasma was generated by supplying a power, and then the doping was continued for 3 sec. At the same time, He was introduced to get a thickness of 20 nm at 100 W as a relatively small power. A supply of $BF_3$ was stopped after a quantity of the dopant come up to a predetermined dopant quantity. The He plasma irradiation was continued while measuring a thickness by the photometer. When it was confirmed that an optical thickness of the impurity doped layer reaches 20 nm after 5 sec elapsed, the plasma was stopped and the process was ended.

Example 4

Next, an example in which a ratio between an irradiation time of the plasma containing the dopant substance and an irradiation time of the plasma not containing the dopant substance is adjusted will be explained hereunder as Example 4. In order to simplify the explanation, the optical properties of the solid state base body, especially an example in which the impurity doped layer 110 having the large light absorption coefficient in the annealing such as the light irradiation, or the like executed subsequently after the doping process is formed, will be explained herein. For example, when the plasma doping system shown in FIG. 4 is employed, normally such a case was supposed that the light absorption coefficient of the impurity doped layer 110, which is formed by the plasma doping using a necessary quantity of dopant, is inadequate for the annealing.

At that time, only the light absorption coefficient is adjusted to have a large value and not to vary a dopant quantity, then a rare gas, e.g., Ar is introduced from the second line 290 to dope the second substance such that a predetermined light absorption coefficient in the annealing can be set, and then another plasma different from the dopant is formed and irradiated onto the solid state base body. Although a mere single example, the impurity doped layer 110 is formed by irradiating the Ar plasma onto the solid state base body 100 for 5 sec. At that time, a plasma irradiation time and other plasma parameters are adjusted such that the light absorption coefficient has a large value enough to execute subsequently the annealing. Then, a gas obtained by diluting $B_2H_6$ with He to 0.5% is introduced from the first line 280 provided for the dopant substance to generate the plasma, and then the plasma is irradiated for 15 sec.

Figure 6A:
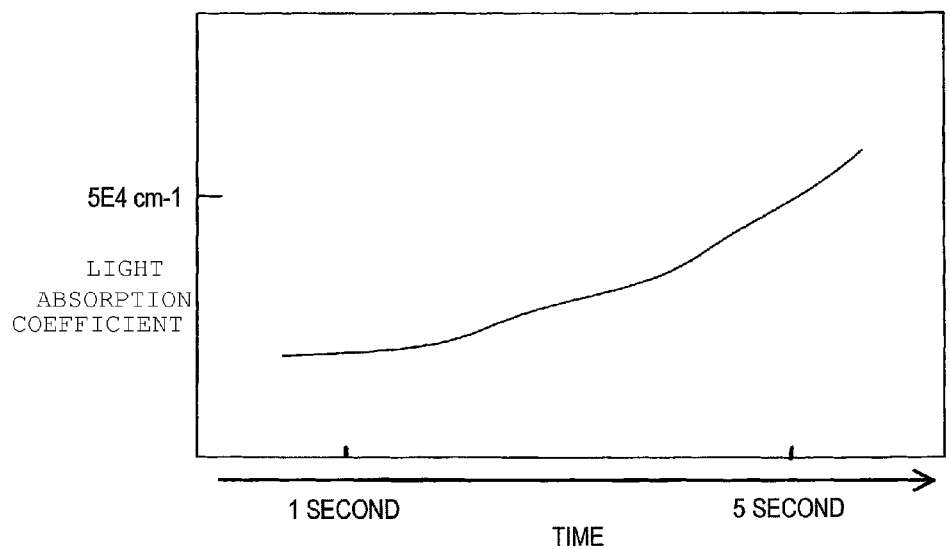
FIG. 6 is graphs showing a dependency of the light absorption coefficient on a process time (a) and a wavelength (b) in the impurity doping method in Example 3 of the present invention.

The optical physical properties of the impurity doped layer 110 formed compositely by using first the Ar plasma and then the dopant plasma were measured via the photometer 130, then predetermined optical characteristics, i.e., the light absorption coefficient here, were derived via a series of control systems, and then the process was ended. FIG. 6(a) shows qualitatively a dependency of an increase of the light absorption coefficient on a process time at a time of Ar irradiation. The process was shifted to the dopant process after it was checked that the light absorption coefficient is increased in excess of $5 E^4 cm^{-1}$ for about 5 sec.

According to this method, the effective annealing could also be achieved.

Example 5

Next, Example 5 of the present invention will be explained hereunder. In this Example, the optical characteristics of the impurity doped layer 110 were also controlled by the feedback control, as in Examples 1 to 4. The case where a liquid crystal substrate is used as the solid state base body 100 will be explained hereunder. In this case, a polycrystalline silicon was deposited on a glass or a quartz glass substrate, and then the impurity used to form TFTs was doped into this polycrystalline silicon. Since such polycrystalline silicon deposited on the glass substrate is a thin film, it is possible that a thickness of the impurity doped layer 110 formed in doping the impurity occupies most of the thin film.

The light absorption coefficient was extracted from the optical constants measured by the photometer 130. In the formation of the liquid crystal device, the method of irradiating the laser onto the impurity doped layer to activate electrically it after the dopant substance is doped was employed. Therefore, the impurity doped layer was adjusted and the light absorption coefficient was controlled such that this laser light can be absorbed effectively.

In this Example, the impurity doping system shown in FIG. 4 was employed, the optical characteristics of the impurity doped layer were measured by the photometer 130, and a doping quantity was adjusted while feeding back the measurement result. A supply of the dopant substance was stopped according to the measurement result by the photometer 130, and the impurity doping process was ended.

According to this method, the activation could be attained effectively. Thus, a temperature rise of the glass substrate was small, generation of warp, distortion, crack, etc. could be suppressed, and a yield could be improved.

Similarly this method can be controlled satisfactorily when other substance, e.g., the silicon substrate, is used as the solid state base body.

Example 6

Next, Example 6 of the present invention will be explained hereunder.

In this Example, as shown in the embodiment 1, the optical characteristics of the impurity doped layer 110 into which the impurity was doped were measured, and then the activation of the impurity doped layer was attained by adjusting the annealing conditions in response to the result not to raise a substrate temperature.

Here, the electromagnetic wave containing a particular wavelength was irradiated onto the solid state base body 100, on which the impurity doped layer 110 formed by the already-described method is formed, to anneal. An energy of the electromagnetic wave was employed to contribute particularly effectively to the electrical activation of the impurity doped layer, but a supply of energy to other areas (solid state base body) was suppressed and a temperature rise of the solid state base body 100 was suppressed.

Figure 6B:
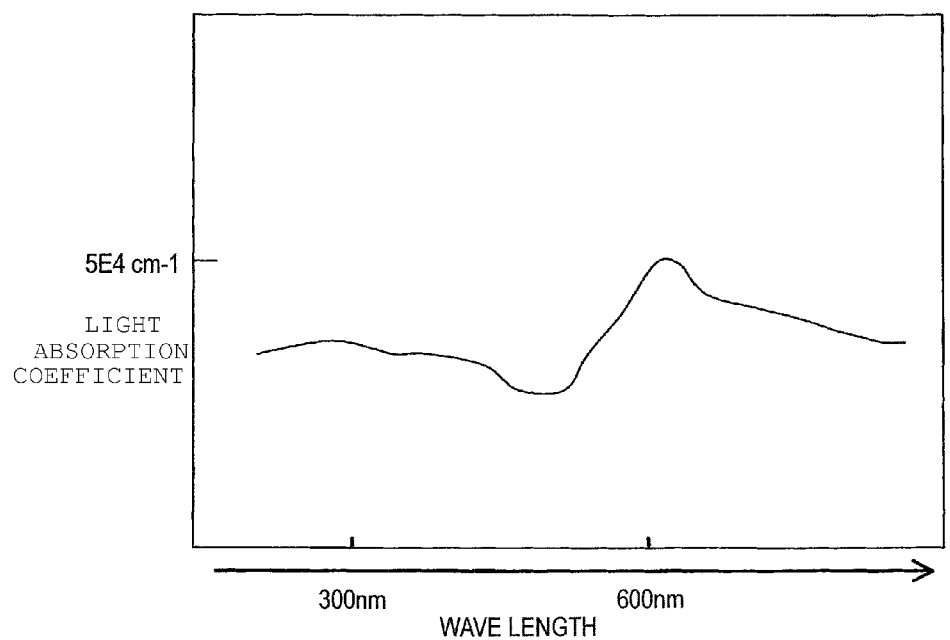

Like the embodiment 1, a light was irradiated onto the impurity doped layer 110 formed on the surface of the solid state base body 100 from the light source 120, and then the light was measured by the photometer 130. The spectrum representing the optical characteristics of the impurity doped layer 110 is shown in FIG. 6(b). The spectrum in FIG. 6(b) was measured by utilizing the ellipsometry, and major factors of the annealing step as the next step were decided based on the measurement result.

The boron was doped in the single crystal silicon substrate by the plasma doping in accordance with the method shown in the embodiment 2.

As the result obtained when the optical measurement of the solid state base body 100 containing the impurity doped layer 110 formed at this time was similarly taken, the spectrum having a peak near 600 nm was observed, as shown in FIG. 6(b). In this case, it is effective to irradiate only the light with a wavelength, which is effective for the annealing, onto the substrate having the impurity doped layer, while employing either the laser light that emits a light near 600 nm or the filter to cut a wavelength except the wavelength of 580 nm to 620 nm when a white light source having a slightly wide peak, for example, is employed.

For this reason, in this Example 6, an example in which the wavelength control is carried out by using a filter will be explained hereunder.

Figure 7:
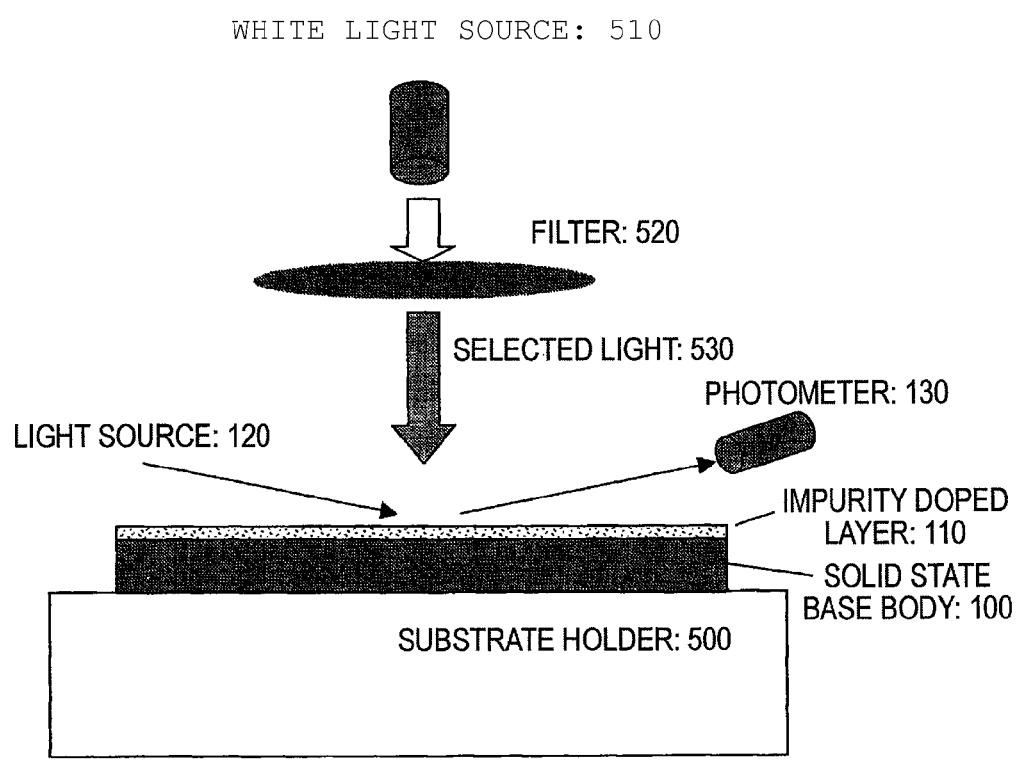
FIG. 7 is an explanatory view of an annealing furnace using a white light source in Example 6 of the present invention and a wavelength selecting filter.

As shown in FIG. 7, this annealing furnace is constructed to have a substrate holder 500, a white light source 510, and a filter 520 provided detachably to transmit only a selected light 530 having a particular wavelength from the white light source.

In this example, the solid state base body 100 on which the impurity doped layer 110 was loaded on the substrate holder 500, and then the light emitted from the white light source or adjusted via the filter to have the predetermined wavelength was irradiated onto the impurity doped layer 110 formed on the surface of the solid state base body, and thus the appropriate annealing was executed.

More particularly, the light source containing a particular wavelength to form a peak in the wavelength spectrum shown in FIG. 6 was provided, and the filter 520 having such a characteristic that only a wavelength suited to anneal the substrate is passed (e.g., the characteristic containing a peak of the wavelength spectrum) was provided. In this system, the light 530 that is irradiated from the light source at an intensity of 100 W, i.e., the white light source 510 in this case and then filtered within 580 nm to 620 nm by the filter 520 is irradiated. An energy of the light 530 being filtered in this manner was absorbed effectively by the impurity doped layer 110 on the substrate and attenuated, and thus a quantity of energy absorbed by the solid state base body 100 was very small.

In this way, a temperature of the overall solid state base body is seldom increased and the energy is absorbed only by the impurity doped layer 110, so that the impurity annealing layer limited within a particular area can be formed. This method is very useful for forming a MOS transistor placed in a miniaturized range area, and the like.

Here, a cooling mechanism (not shown) may be provided to the substrate holder 500, and the substrate can be cooled further. However, according to the present invention, the effective energy can be absorbed by the impurity doped layer 110, and therefore such cooling mechanism is not so needed.

Further, when the light source 120 and the photometer 130 are provided to the annealing furnace shown in FIG. 7 by using the same mechanism as that employed in the doping system shown in FIG. 4 and then the optical properties of the impurity doped layer 110 are measured, the change of physical properties in the light irradiation was measured. In this fashion, the state change caused by the light irradiation could be measured.

In the above Examples, the light of a desired wavelength was irradiated by using the white light source and the filter. In this Example, a laser light source having an adequate wavelength (for example, 600 nm in this case) may be utilized in place of the white light source 510.

Conversely, the impurity doped layer having desired optical characteristics may also be designed to conform to a wavelength of the laser light source that is industrially available inexpensively.

Example 7

Next, a method of mixing a nitrogen and an oxygen as a mixed substance upon the plasma doping will be explained hereunder, as Example 7 of the present invention. First, the impurity doped layer 110 of 10 nm thickness was formed on the solid state base body by the impurity doping applied by the method, described in the embodiment 2, while using the doping system shown in FIG. 4.

Then, a nitrogen or a gas containing a nitrogen was introduced via the second line 290 that is used to introduce the second substance as other substance, then the plasma was generated, and then an upper portion of the impurity doped layer 110 was nitrided by a depth of about 3 nm.

Figure 8A:
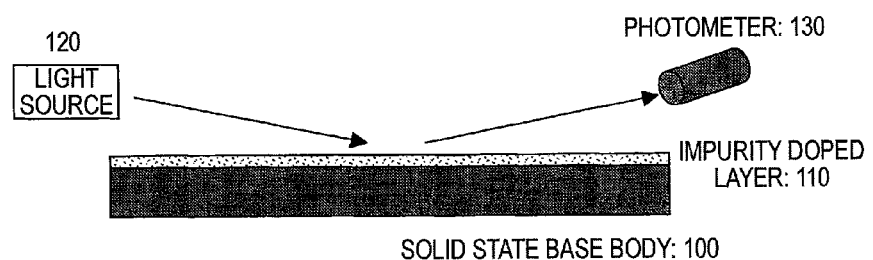
FIG. 8 is schematic sectional views of a solid state base body used to explain a special effect when the impurity doped layer in Example 7 of the present invention is nitrided or oxidized, FIG. 9 a system conceptual view of the annealing furnace in Example 7 of the present invention.
Figure 8B:
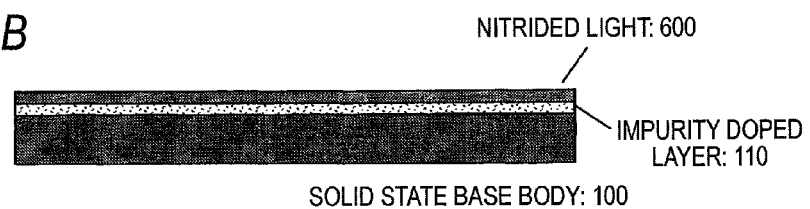

In this manner, the nitrided condition could be controlled into the optical characteristics that meet the annealing such as the light irradiation executed subsequently, by measuring the optical characteristics containing the impurity doped layer 110 and a nitrided light 600 (see FIG. 8), i.e., by using the light source 120 and the photometer 130, the computer 320, the control circuit 340, and the controller 350 provided to the system in FIG. 4.

The term "meeting" of the optical characteristics described here is similar basically to that described in Example 1. But the absorbency of the light used in the annealing step could be enhanced by coating the impurity doped layer 110 with an oxidized light 610 before the annealing. Further, the oxidization generated by engagement of an oxygen and a water content in the air at a time of annealing could be prevented correspondingly. Thus, such an advantage could also be accompanied that total optical characteristics of the impurity doped layer 110 and the nitrided light 600 can be stabilized.

Figure 8C:
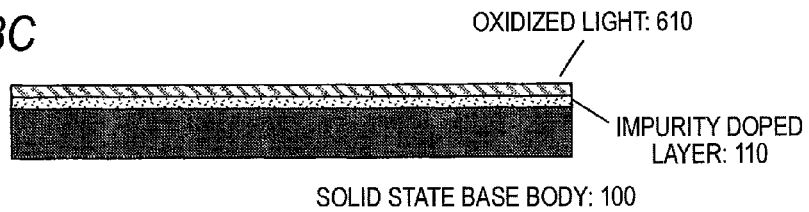

Also, as shown in FIG. 8(c), the surface of the impurity doped layer 110 could be oxidized by introducing an oxygen or a gas containing an oxygen as the third substance via the third line 300. At this time, the optical characteristics of the impurity doped layer 110 and the oxidized light 610 could also be controlled into the optical characteristics that meet the wavelength of the light used in the annealing such as the light irradiation executed subsequently, by using the light source 120 and the photometer 130, the computer 320, the control circuit 340, and the controller 350 provided to the system in FIG. 4. It was difficult to prevent the oxidation at a time of annealing, but the introduction of such surface oxidized layer could also be applied by taking a measure, e.g., using a vacuum or an inert gas in the annealing atmosphere.

Here, an example in which the impurity doped layer 110 is directly nitrided and oxidized was explained. But the silicon oxide film or other film may be deposited by the so-called CVD technology, for example, by the method of introducing $SiH_4$ and the oxygen via the second line 290 used to supply the second substance and the third line 300 used to supply the third substance respectively. If doing so, a thin film that has no relevance to the physical properties of the impurity doped layer can also be deposited, and various optical characteristics can be obtained. Also, it is of vital importance in the deposition that the optical characteristics should be controlled by operating the above controlling system.

Example 8

Next, a method of changing sequentially the annealing conditions following upon the change in the optical characteristics of the impurity doped area in the annealing step will be explained hereunder.

Figure 9:
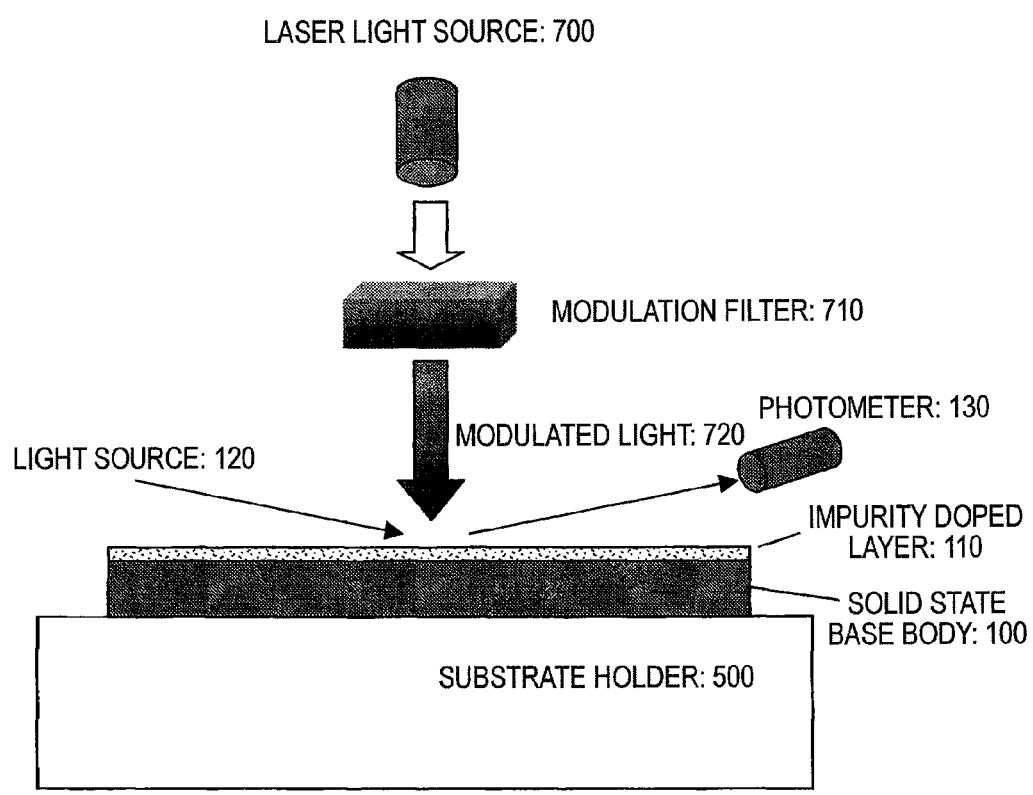

Here, as shown in FIG. 9, a laser light source 700 is used as the light source, a modulation filter 710 capable of changing a wavelength is used on this optical path, and a modulated light 720 to follow upon the condition of the impurity doped layer 110 measure by the photometer 130 is irradiated onto the impurity doped layer 110 on the surface of the solid state base body 100.

The impurity doped layer 110 having a different condition from the solid state base body is formed to contact the solid state base body 100, and then a thin nitride film, a thin oxide film, or the like is formed to protect the impurity doped layer or control the optical characteristics. Then, in annealing the resultant structure by irradiating the electromagnetic wave such as the light, or the like, it is needless to say that the impurity doped layer most suitable for the annealing can be formed at first to meet the wavelength peculiar to the laser having a center wavelength by paying an enough attention as described in the above embodiments. In addition, it is desired that, in order to get the best result in the annealing step, the annealing conditions should be changed to follow the condition of the impurity doped layer that is changed by the light irradiation.

Figure 10:
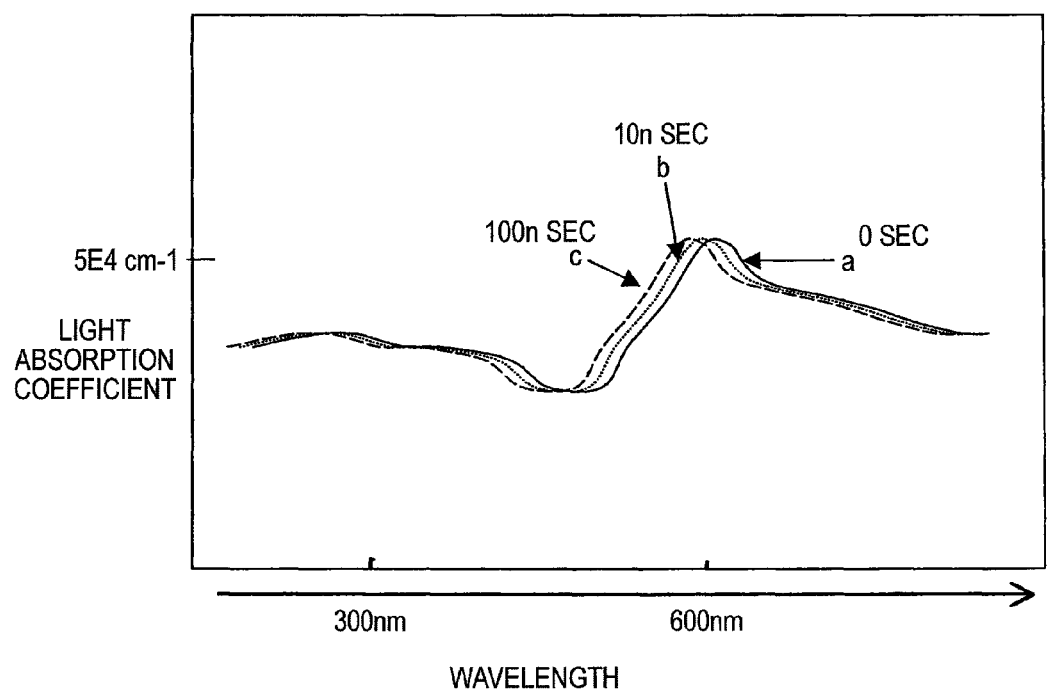
FIG. 10 is a graph explaining an example in which a light of a wavelength that responds to a transition of time is irradiated in annealing the impurity doped layer.

FIG. 10 shows the condition in which the light absorption coefficient is changed by a light irradiation time. That is, a behavior in which the light absorbing characteristic indicated with a curve a prior to the light irradiation is transferred to a curve b after 10 nsec from the light irradiation and then transferred to a curve c after 100 nsec is shown.

This indicates that a center of the light absorption is shifted gradually during the annealing time. Since the light of all wavelengths is contained as the feature of the annealing executed by using the white light, this annealing can respond naturally to the change of this light absorption, but all lights containing unnecessary wavelengths must be irradiated for that purpose. Therefore, as explained in Example 5, defects are caused such that a temperature of the overall substrate or a temperature near the surface of the solid state base body is increased, or the like.

Hence, first the laser having a center wavelength near 600 nm in this case is used. As shown in FIG. 9, the laser light source 700 having a center wavelength is provided to this annealing furnace, and then the wavelength is changed in time by the modulation filter 710 provided on the optical path.

In other words, the light incident from the measuring light source 120 is measured by the photometer while the impurity doped layer is being annealed by irradiating the laser light 700. Then, as shown in FIG. 10, a frequency of the irradiated (modulated) light 720 by operating the modulation filter 710 is changed by catching a changing behavior of the light absorption coefficient. As a result, the light having the wavelength that is always most suitable for the light absorption in the annealing time period could be irradiated onto the impurity doped layer 110 that contacts the surface of the solid state base body 100, whereby an annealing efficiency could be maximized. This indicates that the irradiated energy is seldom absorbed by the portion except the impurity doped layer. It is possible to say that, in order to form the "shallow junction" in the semiconductor industry as the major application field of the present invention, this method should be an ideal method that has a highest energy efficiency and can form an extremely shallow junction depth when finished.

Example 9

Next, Example 9 of the present invention will be explained hereunder. In above Example 8, the method of modulating the wavelength of the light following upon the change of the optical characteristics during the annealing in addition to the optical characteristics of the impurity doped layer was explained. In this Example, the impurity doped layer as the doping layer should be formed to meet the wavelength of the laser that is easily available industrially. Concretely the method that has already been explained in Example 7 belongs to this concept.

In other words, as already explained with reference to FIG. 6, the impurity doped layer to set a wavelength range in which the light absorption coefficient is high can be formed by the formation of the impurity doped layer. When the plasma doping method is employed as this method, as explained in Example 3, the impurity doped layer that can have the large light absorption coefficient near the wavelength of the used laser by changing several parameters to change the plasma conditions can be formed.

According to this method, predetermined optical characteristics (here the light absorption coefficient is considered) can be obtained finally by observing always the surface of the solid state base body 100 (see FIG. 4) in the state that the plasma is being generated during the plasma doping (so-called InSitu state), to change the plasma parameters, as shown in Example 4.

Also, the doping is applied to the surface of the solid state base body 100 for a predetermined time, e.g., 5 sec, then the plasma irradiation is stopped once, then the optical characteristics are derived by measuring the light from the light source 120, then the parameters of the plasma explained in Example 3 are changed by feeding back the result, and then the impurity doped layer 110 is formed by executing the plasma doping for next 5 second, for example. The optical characteristics of the impurity doped layer that meets the wavelength of the selected laser light can be set by repeating these steps.

Also, in the above embodiments, the impurity doping step and the annealing step are executed by the separate furnace. But these steps may be executed by the same furnace.

Also, an adjustment of the optical characteristics of the impurity doped layer in the annealing step can be accomplished by a thin film formation by the normal-pressure plasma. In other words, when the optical characteristics of the impurity doped layer are measured and then the thin film formation on the surface following upon the change of the physical properties of the impurity doped layer is executed to compensate the change of the optical characteristics of the impurity doped layer itself caused due to the progress of the annealing, the light absorbency into the impurity doped layer can be increased to meet the annealing conditions.

The present invention is explained in detail with reference to the particular embodiments, but it is apparent for the person skilled in the art that various variations and modifications can be applied without departing from a spirit and a scope of the present invention.

The present application is based upon Japanese Patent Application No. 2003-331330, filed on Sep. 24, 2003 and Japanese Patent Application No. 2004-065317, filed on Mar. 9, 2004, the contents of which are incorporated herein by reference.

INDUSTRIAL APPLICABILITY

The impurity doping method and system of the present invention is able to realize formation of a fine semiconductor area such as formation of a shallow junction, formation of a super thin film, or the like effectively not to rise a substrate temperature, and is effective for formation of the electronic device such as capacitor, varistor, diode, transistor, coil, or the like or effective for the case where the impurity is doped selectively into a large-size substrate such as a liquid crystal substrate, or the like without a temperature rise.

The invention claimed is:

1. An impurity doping system, comprising:
    an impurity doping means for doping an impurity into a surface of a solid state base body;
    a measuring means for measuring an optical characteristic of an area into which the impurity is doped to determine a wavelength effective for annealing the area into which the impurity is doped;
    a filter for passing only the annealing effective wavelength determined by the measuring means based on the measured optical characteristic of the area into which the impurity is doped; and
    an annealing means for annealing the area into which the impurity is doped.

2. The impurity doping system according to claim 1, wherein the impurity doping means is a plasma doping means for doping the impurity into the surface of the solid state base body.

3. The impurity doping system according to claim 1, further comprising:
    a doping controlling means for controlling the impurity doping means based on measurement results of the measuring means.

4. The impurity doping system according to claim 3, further comprising:
    a feedback mechanism for feeding back the measurement results of the measuring means to any one of the filter or the doping controlling means.

5. The impurity doping system according to claim 4, wherein the feedback mechanism executes a feedback of the measurement results in-situ.

6. The impurity doping system according to claim 5, wherein the feedback mechanism executes a sampling inspection, and executes an additional process.

7. An electronic device formed by doping an impurity by using the impurity doping system set forth in claim 1.

8. The impurity doping system according to claim 6, wherein the additional process is an additional doping.

9. The impurity doping system according to claim 6, wherein the additional process is annealing conditions relaxation.

10. The impurity doping system according to claim 1, wherein the filter is a modulation filter capable of changing a wavelength of an irradiated light for the annealing.

* * * * *